US008638597B2

(12) United States Patent
Jung et al.

(10) Patent No.: US 8,638,597 B2
(45) Date of Patent: *Jan. 28, 2014

(54) BIT LINE CHARGE ACCUMULATION SENSING FOR RESISTIVE CHANGING MEMORY

(75) Inventors: Chulmin Jung, Eden Prairie, MN (US); Yong Lu, Rosemount, MN (US); Kang Yong Kim, Boise, ID (US); Young Pil Kim, Eden Prairie, MN (US)

(73) Assignee: Seagate Technology LLC, Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/476,368

(22) Filed: May 21, 2012

(65) Prior Publication Data

US 2012/0230094 A1    Sep. 13, 2012

Related U.S. Application Data

(63) Continuation of application No. 12/326,184, filed on Dec. 2, 2008, now Pat. No. 8,203,869.

(51) Int. Cl.
 *G11C 11/00* (2006.01)
(52) U.S. Cl.
 USPC ............... 365/158; 365/46; 365/55; 365/74; 365/97; 365/100; 365/131; 365/148; 365/171; 365/173; 365/163
(58) Field of Classification Search
 USPC ......... 365/46, 55, 74, 97, 100, 131, 148, 158, 365/171, 173, 163
 See application file for complete search history.

(56) References Cited

U.S. PATENT DOCUMENTS

| 3,982,233 A | 9/1976 | Crookshanks |
| 3,982,235 A | 9/1976 | Bennett |
| 4,056,642 A | 11/1977 | Saxena |
| 4,110,488 A | 8/1978 | Risko |
| 4,160,988 A | 7/1979 | Russell |
| 4,232,057 A | 11/1980 | Ray |
| 4,247,915 A | 1/1981 | Bartlett |
| 4,323,589 A | 4/1982 | Ray |

(Continued)

FOREIGN PATENT DOCUMENTS

| DE | 102008026432 | 12/2009 |
| EP | 1329895 | 7/2003 |

(Continued)

OTHER PUBLICATIONS

Adee, S., "Quantum Tunneling Creates Fast Lane for Wireless", IEEE Spectrum, Oct. 2007.

(Continued)

*Primary Examiner* — Fernando Hidalgo
(74) *Attorney, Agent, or Firm* — Mueting Raasch & Gebhardt

(57) ABSTRACT

A memory array includes a plurality of magneto-resistive changing memory cells. Each resistive changing memory cell is electrically between a source line and a bit line and a transistor electrically between the resistive changing memory cell and the bit line. The transistor has a gate electrically between a source region and a drain region and the source region being electrically between the r magneto-resistive changing memory cell and the gate. A word line is electrically coupled to the gate. A bit line charge accumulation sensing for magneto-resistive changing memory is also disclosed.

12 Claims, 5 Drawing Sheets

(56) References Cited

U.S. PATENT DOCUMENTS

| | | |
|---|---|---|
| 4,576,829 A | 3/1986 | Kaganowicz |
| 4,901,132 A | 2/1990 | Kuwano |
| 5,083,190 A | 1/1992 | Pfiester |
| 5,135,878 A | 8/1992 | Bartur |
| 5,278,636 A | 1/1994 | Williams |
| 5,330,935 A | 7/1994 | Dobuzinsky |
| 5,365,083 A | 11/1994 | Tada |
| 5,412,246 A | 5/1995 | Dobuzinsky |
| 5,443,863 A | 8/1995 | Neely |
| 5,580,804 A | 12/1996 | Joh |
| 5,614,430 A | 3/1997 | Liang |
| 5,739,564 A | 4/1998 | Kosa |
| 5,872,052 A | 2/1999 | Iyer |
| 5,913,149 A | 6/1999 | Thakur |
| 5,923,948 A | 7/1999 | Cathey, Jr. |
| 5,926,412 A | 7/1999 | Evans |
| 5,929,477 A | 7/1999 | McAllister |
| 6,011,281 A | 1/2000 | Nunokawa |
| 6,013,548 A | 1/2000 | Burns |
| 6,034,389 A | 3/2000 | Burns |
| 6,077,745 A | 6/2000 | Burns |
| 6,100,166 A | 8/2000 | Sakaguchi |
| 6,114,211 A | 9/2000 | Fulford |
| 6,121,642 A | 9/2000 | Newns |
| 6,121,654 A | 9/2000 | Likharev |
| 6,165,834 A | 12/2000 | Agarwal |
| 6,300,205 B1 | 10/2001 | Fulford |
| 6,341,085 B1 | 1/2002 | Yamagami |
| 6,346,477 B1 | 2/2002 | Koloyeros |
| 6,376,332 B1 | 4/2002 | Yanagita |
| 6,448,840 B2 | 9/2002 | Kao |
| 6,534,382 B1 | 3/2003 | Sakaguchi |
| 6,617,642 B1 | 9/2003 | Georgesca |
| 6,624,463 B2 | 9/2003 | Kim |
| 6,653,704 B1 | 11/2003 | Gurney |
| 6,667,900 B2 | 12/2003 | Lowrey |
| 6,724,025 B1 | 4/2004 | Takashima |
| 6,750,540 B2 | 6/2004 | Kim |
| 6,753,561 B1 | 6/2004 | Rinerson |
| 6,757,842 B2 | 6/2004 | Harari |
| 6,781,176 B2 | 8/2004 | Ramesh |
| 6,789,689 B1 | 9/2004 | Beale |
| 6,800,897 B2 | 10/2004 | Baliga |
| 6,842,368 B2 | 1/2005 | Hayakawa |
| 6,853,031 B2 | 2/2005 | Lio |
| 6,917,539 B2 | 7/2005 | Rinerson |
| 6,940,742 B2 | 9/2005 | Yamamura |
| 6,944,052 B2 | 9/2005 | Subramanian |
| 6,979,863 B2 | 12/2005 | Ryu |
| 7,009,877 B1 | 3/2006 | Huai |
| 7,045,840 B2 | 5/2006 | Tamai |
| 7,051,941 B2 | 5/2006 | Yui |
| 7,052,941 B2 | 5/2006 | Lee |
| 7,098,494 B2 | 8/2006 | Pakala |
| 7,130,209 B2 | 10/2006 | Reggiori |
| 7,161,861 B2 | 1/2007 | Gogl |
| 7,180,140 B1 | 2/2007 | Brisbin |
| 7,187,577 B1 | 3/2007 | Wang |
| 7,190,616 B2 | 3/2007 | Forbes |
| 7,200,036 B2 | 4/2007 | Bessho |
| 7,205,614 B2 | 4/2007 | Young |
| 7,215,568 B2 | 5/2007 | Liaw |
| 7,218,550 B2 | 5/2007 | Schwabe |
| 7,224,601 B2 | 5/2007 | Panchula |
| 7,233,537 B2 | 6/2007 | Tanizaki |
| 7,236,394 B2 | 6/2007 | Chen |
| 7,247,570 B2 | 7/2007 | Thomas |
| 7,272,034 B1 | 9/2007 | Chen |
| 7,272,035 B1 | 9/2007 | Chen |
| 7,273,638 B2 | 9/2007 | Belyansky |
| 7,274,067 B2 | 9/2007 | Forbes |
| 7,282,755 B2 | 10/2007 | Pakala |
| 7,285,812 B2 | 10/2007 | Tang |
| 7,286,395 B2 | 10/2007 | Chen |
| 7,289,356 B2 | 10/2007 | Diao |
| 7,345,912 B2 | 3/2008 | Luo |
| 7,362,618 B2 | 4/2008 | Harari |
| 7,378,702 B2 | 5/2008 | Lee |
| 7,379,327 B2 | 5/2008 | Chen |
| 7,381,595 B2 | 6/2008 | Joshi |
| 7,382,024 B2 | 6/2008 | Ito |
| 7,391,068 B2 | 6/2008 | Kito |
| 7,397,713 B2 | 7/2008 | Harari |
| 7,413,480 B2 | 8/2008 | Thomas |
| 7,414,908 B2 | 8/2008 | Miyatake |
| 7,416,929 B2 | 8/2008 | Mazzola |
| 7,432,574 B2 | 10/2008 | Nakamura |
| 7,440,317 B2 | 10/2008 | Bhattacharyya |
| 7,459,717 B2 | 12/2008 | Lung |
| 7,465,983 B2 | 12/2008 | Eldridge |
| 7,470,142 B2 | 12/2008 | Lee |
| 7,470,598 B2 | 12/2008 | Lee |
| 7,502,249 B1 | 3/2009 | Ding |
| 7,515,457 B2 | 4/2009 | Chen |
| 7,529,114 B2 | 5/2009 | Asao |
| 7,542,356 B2 | 6/2009 | Lee |
| 7,646,629 B2 | 1/2010 | Hamberg |
| 7,697,322 B2 | 4/2010 | Leuschner |
| 7,738,279 B2 | 6/2010 | Siesazeck |
| 7,738,881 B2 | 6/2010 | Krumm |
| 7,791,057 B2 | 9/2010 | Lung |
| 7,936,583 B2 | 5/2011 | Khoury |
| 2002/0081822 A1 | 6/2002 | Yanageta |
| 2002/0136047 A1 | 9/2002 | Scheuerlein |
| 2003/0045064 A1 | 3/2003 | Kunikiyo |
| 2003/0168684 A1 | 9/2003 | Pan |
| 2004/0084725 A1 | 5/2004 | Nishiwaki |
| 2004/0114413 A1 | 6/2004 | Parkinson |
| 2004/0114438 A1 | 6/2004 | Morimoto |
| 2004/0223355 A1 | 11/2004 | Hidaka |
| 2004/0257878 A1 | 12/2004 | Morikawa |
| 2004/0262635 A1 | 12/2004 | Lee |
| 2005/0044703 A1 | 3/2005 | Liu |
| 2005/0092526 A1 | 5/2005 | Fielder |
| 2005/0122768 A1 | 6/2005 | Fukumoto |
| 2005/0145947 A1 | 7/2005 | Russ |
| 2005/0218521 A1 | 10/2005 | Lee |
| 2005/0253143 A1 | 11/2005 | Takaura |
| 2005/0280042 A1 | 12/2005 | Lee |
| 2005/0280061 A1 | 12/2005 | Lee |
| 2005/0280154 A1 | 12/2005 | Lee |
| 2005/0280155 A1 | 12/2005 | Lee |
| 2005/0280156 A1 | 12/2005 | Lee |
| 2005/0282356 A1 | 12/2005 | Lee |
| 2006/0073652 A1 | 4/2006 | Pellizzer |
| 2006/0131554 A1 | 6/2006 | Joung |
| 2006/0275962 A1 | 12/2006 | Lee |
| 2007/0007536 A1 | 1/2007 | Hidaka |
| 2007/0077694 A1 | 4/2007 | Lee |
| 2007/0105241 A1 | 5/2007 | Leuschner |
| 2007/0113884 A1 | 5/2007 | Kinsey |
| 2007/0115749 A1 | 5/2007 | Gilbert |
| 2007/0253245 A1 | 11/2007 | Ranjan |
| 2007/0279968 A1 | 12/2007 | Luo |
| 2007/0281439 A1 | 12/2007 | Bedell |
| 2007/0297223 A1 | 12/2007 | Chen |
| 2008/0007993 A1* | 1/2008 | Saitoh et al. .......... 365/158 |
| 2008/0029782 A1 | 2/2008 | Carpenter |
| 2008/0032463 A1 | 2/2008 | Lee |
| 2008/0037314 A1 | 2/2008 | Ueda |
| 2008/0038902 A1 | 2/2008 | Lee |
| 2008/0048327 A1 | 2/2008 | Lee |
| 2008/0094873 A1 | 4/2008 | Lai |
| 2008/0108212 A1 | 5/2008 | Moss |
| 2008/0144355 A1 | 6/2008 | Boeve |
| 2008/0170432 A1 | 7/2008 | Asao |
| 2008/0191312 A1 | 8/2008 | Oh |
| 2008/0219044 A1 | 9/2008 | Yoon |
| 2008/0238475 A1* | 10/2008 | Chua-Eoan et al. ......... 326/38 |
| 2008/0261380 A1 | 10/2008 | Lee |
| 2008/0265360 A1 | 10/2008 | Lee |
| 2008/0273380 A1 | 11/2008 | Diao |
| 2008/0310213 A1 | 12/2008 | Chen |
| 2008/0310219 A1 | 12/2008 | Chen |

(56) References Cited

U.S. PATENT DOCUMENTS

| | | | |
|---|---|---|---|
| 2009/0014719 A1 | 1/2009 | Shimizu | |
| 2009/0040855 A1 | 2/2009 | Luo | |
| 2009/0052225 A1 | 2/2009 | Morimoto | |
| 2009/0072246 A1 | 3/2009 | Genrikh | |
| 2009/0072279 A1 | 3/2009 | Moselund | |
| 2009/0161408 A1 | 6/2009 | Tanigami | |
| 2009/0162979 A1 | 6/2009 | Yang | |
| 2009/0185410 A1 | 7/2009 | Huai | |
| 2009/0296449 A1 | 12/2009 | Slesazeck | |
| 2010/0007344 A1 | 1/2010 | Guo | |
| 2010/0014347 A1* | 1/2010 | Wang et al. | 365/171 |
| 2010/0067281 A1 | 3/2010 | Xi | |
| 2010/0110756 A1 | 5/2010 | Khoury | |
| 2010/0149856 A1 | 6/2010 | Tang | |

FOREIGN PATENT DOCUMENTS

| | | |
|---|---|---|
| WO | WO 0062346 | 10/2000 |
| WO | WO 0215277 | 2/2002 |
| WO | WO 2005/124787 | 12/2005 |
| WO | WO 2006/100657 | 9/2006 |
| WO | WO 2007/100626 | 9/2007 |
| WO | WO 2007/128738 | 11/2007 |

OTHER PUBLICATIONS

Berger et al., Merged-Transitor Logic (MTL)—A Low-Cost Bipolar Logic Concept, Solid-State Circuits, IEEE Journal, vol. 7, Issue 5, pp. 340-346 (2003).

Chung et al., A New SOI Inverter for Low Power Applications, Proceedings 1996 IEEE International SOI Conference, Oct. 1996.

Giacomini, R., et al., Modeling Silicon on Insulator MOS Transistors with Nonrectangular-Gate Layouts, Journal of the Electrochemical Society, 2006, pp. G218-G222, vol. 153, No. 3.

Hosomi et al., A Novel Nonvolatile Memory with Spin Torque Transfer Magnetization Switching: Spin-RAM, 2005 IEEE.

Hwang et al., Degradation of MOSFET's Drive Current Due to Halo Ion Implantation, Electron Devices Meeting, 1996, International Date: Dec. 8-11, 1996, pp. 567-570.

Internet website www.en.wikipedia.org/wiki/High-k dated Nov. 12, 2008.

Likharev, K., "Layered tunnel barrier for nonvolatile memory devices", Applied Physics Letters vol. 73, No. 15; Oct. 12, 1998.

Londergran et al., Interlayer Mediated Epitaxy of Cobalt Silicide on Silicon (100) from Low Temperature Chemical Vapor Deposition of Cobalt, Journal of the Electrochemical Society, 148 (1) C21-C27 (2001) C21.

PCT/ISA/210 Int'l. Search Report and PCT/ISA/237 Written Opinion for PCT/US2010/041134 from the EPO.

Romanyuk, A., et al., Temperature-induced metal-semiconductor transition in W-doped VO2 films studied by photoelectron spectroscopy, Solar Energy Materials and Solar Cells, 2007, pp. 1831-1835, No. 91, Elsevier, Switzerland.

Sayan, S., "Valence and conduction band offsets of a ZrO2/SiOxNy/n-Si CMOS gate stack: A combined photoemission and inverse photoemission study", Phys. Stat. Sol. (b) 241, No. 10, pp. 2246-2252 (2004).

Takato et al., High Performance CMOS Surrounding Gate Transistor (SGT) for Ultra High Density LSIs, Downloaded on Apr. 14, 2009 from IEEE Xplore, pp. 222-225.

U.S. Appl. No. 12/175,545, filed Jul. 18, 2008, Inventors: Lou et al., Our Ref: 14229.00.

U.S. Appl. No. 12/120,715, filed May 15, 2008, Inventors: Tian et al.

U.S. Appl. No. 12/498,661, filed Jul. 7, 2009, Inventor: Khoury.

U.S. Appl. No. 12/502,211, filed Jul. 13, 2009, Inventor: Lu.

Wang et al., Precision Control of Halo Implanation for Scaling-down ULSI Manufacturing, IEEE International Symposium on Sep. 13-15, 2005, pp. 204-207.

Zahler, James, et al., Wafer Bonding and Layer Transfer Processes for High Efficiency Solar Cells, NCPV and Solar Program Review Meeting, pp. 723-726, 2003.

* cited by examiner

BIT LINE CHARGE ACCUMULATION SENSING FOR RESISTIVE CHANGING MEMORY

CROSS-REFERENCE TO RELATED APPLICATION

This application is a continuation application of Ser. No. 12/326,184, filed Dec. 2, 2008, the contents of which is hereby incorporated by reference in its entirety.

BACKGROUND

Fast growth of the pervasive computing and handheld/communication industry generates exploding demand for high capacity nonvolatile solid-state data storage devices. However, flash memory has several drawbacks such as slow access speed (~ms write and ~50-100 ns read), limited endurance (~100K programming cycles), and the difficulty of integration in system-on-chip (SoC). Flash memory (NAND or NOR) also faces significant scaling problems at 32 nm node and beyond.

Magnetic Random Access Memory (MRAM) is a promising candidate for future nonvolatile and universal memory. MRAM features non-volatility, fast writing/reading speed (<10 ns), almost unlimited programming endurance (>$10^{15}$ cycles) and zero standby power. The basic component of MRAM is a magnetic tunneling junction (MTJ). Data storage is realized by switching the resistance of the MTJ between a high-resistance state and a low-resistance state. MRAM switches the MTJ resistance by using a current induced magnetic field to switch the magnetization of the MTJ.

Recently, a new write mechanism, which is based upon spin polarization current induced magnetization switching, was introduced to the MRAM design. This new MRAM design, called Spin-Transfer Torque RAM (STRAM), uses a (bidirectional) current through the MTJ to realize the resistance switching. Therefore, the switching mechanism of STRAM is constrained locally and STRAM is believed to have a better scaling property than the conventional MRAM.

Steady current injection has been used to sense the logic state of MRAM. As the density of the memory devices increases, the length of the bit lines, source lines and word lines increase and add resistance to the circuit design. The added and variable resistance in the MRAM array complicates the sensing of the logic state of the individual memory units.

BRIEF SUMMARY

The present disclosure relates to a bit line charge accumulation sensing for resistive changing memory. In particular, the present disclosure relates to a bit line charge accumulation sensing for magneto-resistive changing memory.

In one particular embodiment, a memory array includes a plurality of magneto-resistive changing memory cells. Each magneto-resistive changing memory cell is electrically coupled to a source line and a bit line. A transistor is electrically between the magneto-resistive changing memory cell and the bit line. The transistor has a gate electrically between a source region and a drain region and the source region being electrically between the magneto-resistive changing memory cell and the gate. A word line is electrically coupled to the gate.

In another embodiment, a method of sensing a data or logic state of magneto-resistive changing memory, includes pre-charging a bit line to a predetermined bit line charge level having a bit line precharge voltage value and applying a current to a word line. The word line is electrically coupled to a gate of a transistor. The current discharges the bit line charge through a selected magneto-resistive changing memory cell and reduces the bit line precharge voltage value to a bit line voltage value. Then the method includes sensing the bit line voltage value to determine a data or logic state of the resistive changing memory.

These and various other features and advantages will be apparent from a reading of the following detailed description.

BRIEF DESCRIPTION OF THE DRAWINGS

The disclosure may be more completely understood in consideration of the following detailed description of various embodiments of the disclosure in connection with the accompanying drawings, in which.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

In the following description, reference is made to the accompanying set of drawings that form a part hereof and in which are shown by way of illustration several specific embodiments. It is to be understood that other embodiments are contemplated and may be made without departing from the scope or spirit of the present disclosure. The following detailed description, therefore, is not to be taken in a limiting sense. The definitions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

The recitation of numerical ranges by endpoints includes all numbers subsumed within that range (e.g. 1 to 5 includes 1, 1.5, 2, 2.75, 3, 3.80, 4, and 5) and any range within that range.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

The present disclosure relates to a bit line charge accumulation sensing for resistive changing memory. Utilizing this method, data sensing issues can be greatly reduced regardless of bit line resistance, and process, voltage, or temperature variation. Some advantages of this bit line charge accumulation sensing method include; bit line resistance variation can be disregarded, the word line pulse width and amplitude are not critical, and the method is immune to power noise. In addition, this method provides a large voltage difference between the reference voltage and the sensed voltage, allowing for a robust read operation. While the present disclosure is not so limited, an appreciation of various aspects of the disclosure will be gained through a discussion of the examples provided below.

Figure 1:
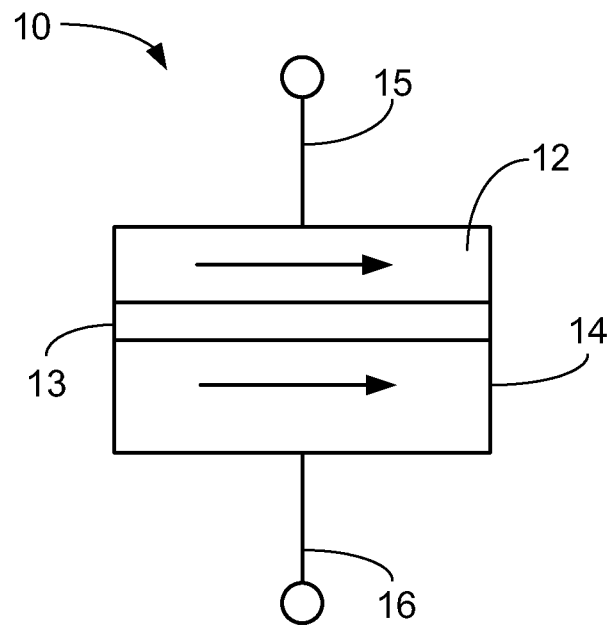
FIG. 1 is a cross-sectional schematic diagram of an illustrative resistive changing memory cell in the low resistance state.
Figure 2:
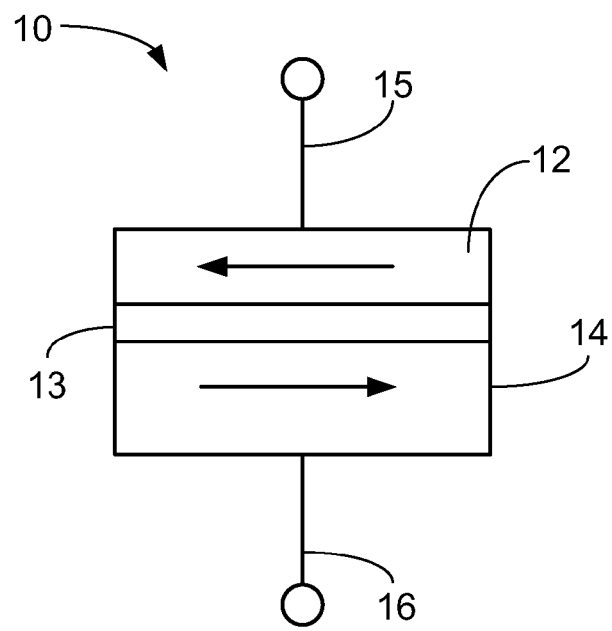
FIG. 2 is a cross-sectional schematic diagram of the illustrative resistive changing memory cell in the high resistance state.

FIG. 1 is a cross-sectional schematic diagram of an illustrative magneto-resistive changing memory cell 10 in the low resistance state and FIG. 2 is a cross-sectional schematic diagram of the illustrative magneto-resistive changing memory cell 10 in the high resistance state. The magneto-resistive changing memory cell can be any useful magnetic memory cell that can switch between a high resistance state and a low resistance state. In many embodiments, the magneto-resistive changing memory cell described herein is a spin-transfer torque memory cell.

The magneto-resistive changing memory cell 10 includes a ferromagnetic free layer 12 and a ferromagnetic reference (i.e., pinned) layer 14. The ferromagnetic free layer 12 and a ferromagnetic reference layer 14 are separated by an oxide barrier layer 13 or tunnel barrier. A first electrode 15 is in electrical contact with the ferromagnetic free layer 12 and a second electrode 16 is in electrical contact with the ferromagnetic reference layer 14. The ferromagnetic layers 12, 14 may be made of any useful ferromagnetic (FM) alloys such as, for example, Fe, Co, Ni and the insulating barrier layer 13 may be made of an electrically insulating material such as, an oxide material (e.g., $Al_2O_3$ or MgO). Other suitable materials may also be used.

The electrodes 15, 16 electrically connect the ferromagnetic layers 12, 14 to a control circuit providing read and write currents through the ferromagnetic layers 12, 14. The resistance across the magneto-resistive changing memory cell 10 is determined by the relative orientation of the magnetization vectors or magnetization orientations of the ferromagnetic layers 12, 14. The magnetization direction of the ferromagnetic reference layer 14 is pinned in a predetermined direction while the magnetization direction of the ferromagnetic free layer 12 is free to rotate under the influence of a spin torque or an applied magnetic field. Pinning of the ferromagnetic reference layer 14 may be achieved through, e.g., the use of exchange bias with an antiferromagnetically ordered material such as PtMn, IrMn and others.

FIG. 1 illustrates the magneto-resistive changing memory cell 10 in the low resistance state where the magnetization orientation of the ferromagnetic free layer 12 is parallel and in the same direction of the magnetization orientation of the ferromagnetic reference layer 14. This is termed the low resistance state or "0" data state. FIG. 2 illustrates the magneto-resistive changing memory cell 10 in the high resistance state where the magnetization orientation of the ferromagnetic free layer 12 is anti-parallel and in the opposite direction of the magnetization orientation of the ferromagnetic reference layer 14. This is termed the high resistance state or "1" data state.

Switching the resistance state and hence the data state of the magneto-resistive changing memory cell 10 via spin-transfer occurs when a current, passing through a magnetic layer of the magneto-resistive changing memory cell 10, becomes spin polarized and imparts a spin torque on the free layer 12 of the magneto-resistive changing memory cell 10. When a sufficient spin torque is applied to the free layer 12, the magnetization orientation of the free layer 12 can be switched between two opposite directions and accordingly the magneto-resistive changing memory cell 10 can be switched between the parallel state (i.e., low resistance state or "0" data state) and anti-parallel state (i.e., high resistance state or "1" data state) depending on the direction of the current.

The illustrative magneto-resistive changing memory cell 10 may be used to construct a memory device that includes multiple magneto-resistive changing memory cell 10 where a data bit is stored in a magnetic tunnel junction of the magneto-resistive changing memory cell 10 by changing the relative magnetization state of the free magnetic layer 12 with respect to the pinned magnetic layer 14. The stored data bit can be read out by measuring the resistance of the cell. The magneto-resistive changing memory cell 10 exhibits the characteristics of a non-volatile random access memory by the free layer having thermal stability against random fluctuations so that the orientation of the free layer is changed only when it is controlled to make such a change. This thermal stability can be achieved via the magnetic anisotropy and crystalline anisotropy. Additional anisotropy can be obtained through magnetic coupling to other magnetic layers either through exchange or magnetic fields. Generally, the anisotropy causes a soft and hard axis to form in thin magnetic layers. The hard and soft axes are defined by the magnitude of the external energy, usually in the form of a magnetic field, needed to fully rotate (saturate) the direction of the magnetization in that direction, with the hard axis requiring a higher saturation magnetic field.

Figure 3:
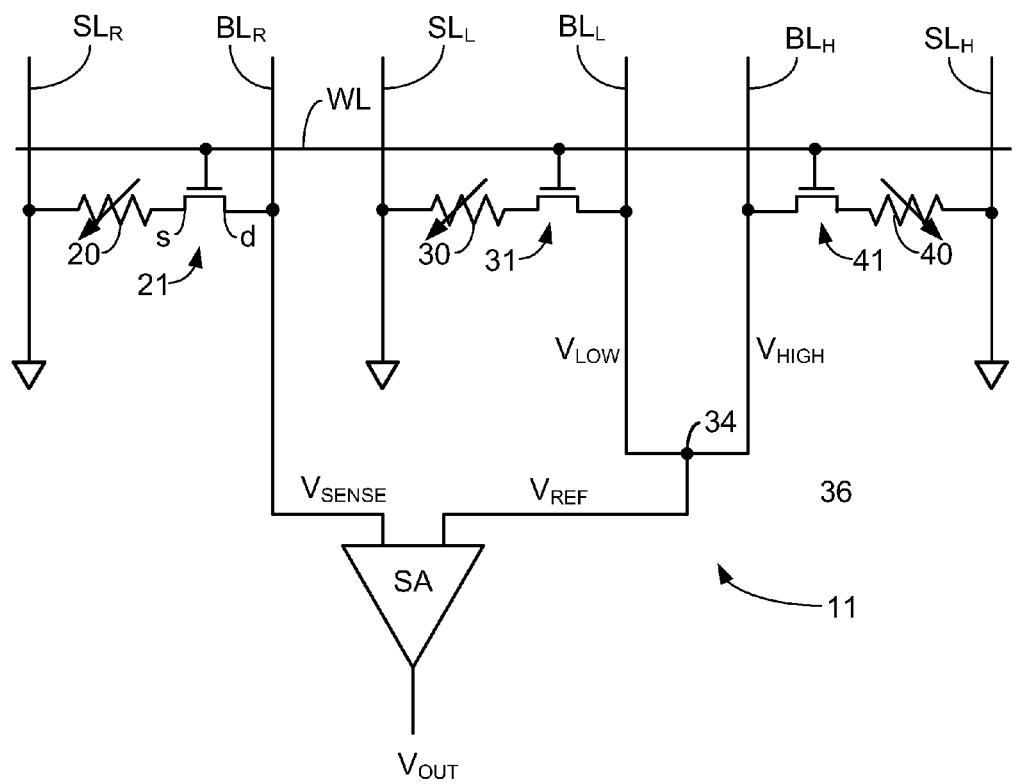
FIG. 3 is schematic circuit diagrams of a memory apparatus.

FIG. 3 is schematic circuit diagram of a memory apparatus 11. The memory apparatus 11 includes a magneto-resistive changing memory cell 20 electrically coupled to a read bit line $BL_R$ and a read source line $SL_R$. The magneto-resistive changing memory cell 20 is configured to switch between a high resistance state and a low resistance state, as described above. The read transistor 21 is electrically coupled to the read bit line $BL_R$ and the variable magneto-resistive memory cell 20. The gate of the read transistor 21 is electrically coupled to a word line WL. The read transistor 21 can be any useful transistor such as a NMOS semiconductor device. The transistor 21 has a source region s and a drain region d as is known in NMOS semiconductor devices. The source region s is electrically between the magneto-resistive changing memory cell 20 and the gate of the read transistor 21. The read bit line $BL_R$ is electrically coupled to a sense amplifier SA and provides the voltage $V_{SENSE}$ to the sense amplifier SA for comparison with the average (described below) reference voltage $V_{REF}$.

A low resistance state reference memory cell 30 is electrically between a low resistance state reference bit line $BL_L$ and a low resistance state reference source line $SL_L$. A low resistance state reference transistor 31 is electrically coupled to the low resistance state reference bit line $BL_L$ and the low resistance state reference memory cell 30. The low resistance state reference transistor 31 is electrically coupled to the word line WL. The low resistance state reference transistor 31 can be any useful transistor such as a NMOS semiconductor device, as described above where a source region of the transistor 31 is electrically coupled to the gate of the transistor 31 and the low resistance state reference memory cell 30. The low resistance state reference bit line $BL_L$ provides a low resistance state voltage $V_{LOW}$ to a node 34 and, when combined with a high resistance state voltage $V_{HIGH}$, described below, provides an average reference voltage $V_{REF}$ to the sense amplifier SA.

A high resistance state reference memory cell 40 is electrically between a high resistance state reference bit line $BL_H$ and a high resistance state reference source line $SL_H$. A high resistance state reference transistor 41 is electrically coupled to the high resistance state reference bit line $BL_H$ and the high resistance state reference variable resistive memory cell 40. The high resistance state reference transistor 41 is electrically coupled to the word line WL. The high resistance state reference transistor 41 can be any useful transistor such as a NMOS semiconductor device, as described above where a source region of the transistor 41 is electrically coupled to the gate of the transistor 41 and the high resistance state reference memory cell 40. The high resistance state reference bit line $BL_H$ provides a high resistance state voltage $V_{HIGH}$ to node 34 and, when combined with the low resistance state voltage $V_{LOW}$, described above, provides an average reference voltage $V_{REF}$ to the sense amplifier SA.

The average reference voltage $V_{REF}$ and the voltage $V_{SENSE}$ are provided to the sense amplifier SA for comparison. The average reference voltage $V_{REF}$ is equal to ($V_{LOW}$+$V_{HIGH}$)/2 and it is substantially the midpoint voltage value between $V_{LOW}$ and $V_{HIGH}$. The sense amplifier SA provides an output voltage $V_{OUT}$ to indicate whether the resistive changing memory cell 20 is in a high resistance state or a low resistance state. As illustrated, all three resistive changing memory cells 20, 30, 40 share a common word line WL. In many embodiments, the data cell 20 and the reference cells 30, 40 have sustainably the same structure (as described above) and are formed on-chip at substantially the same time. This eliminates several of the process, voltage and operation (e.g., temperature) variations that can plague memory structures that are not formed on-chip.

Figure 4:
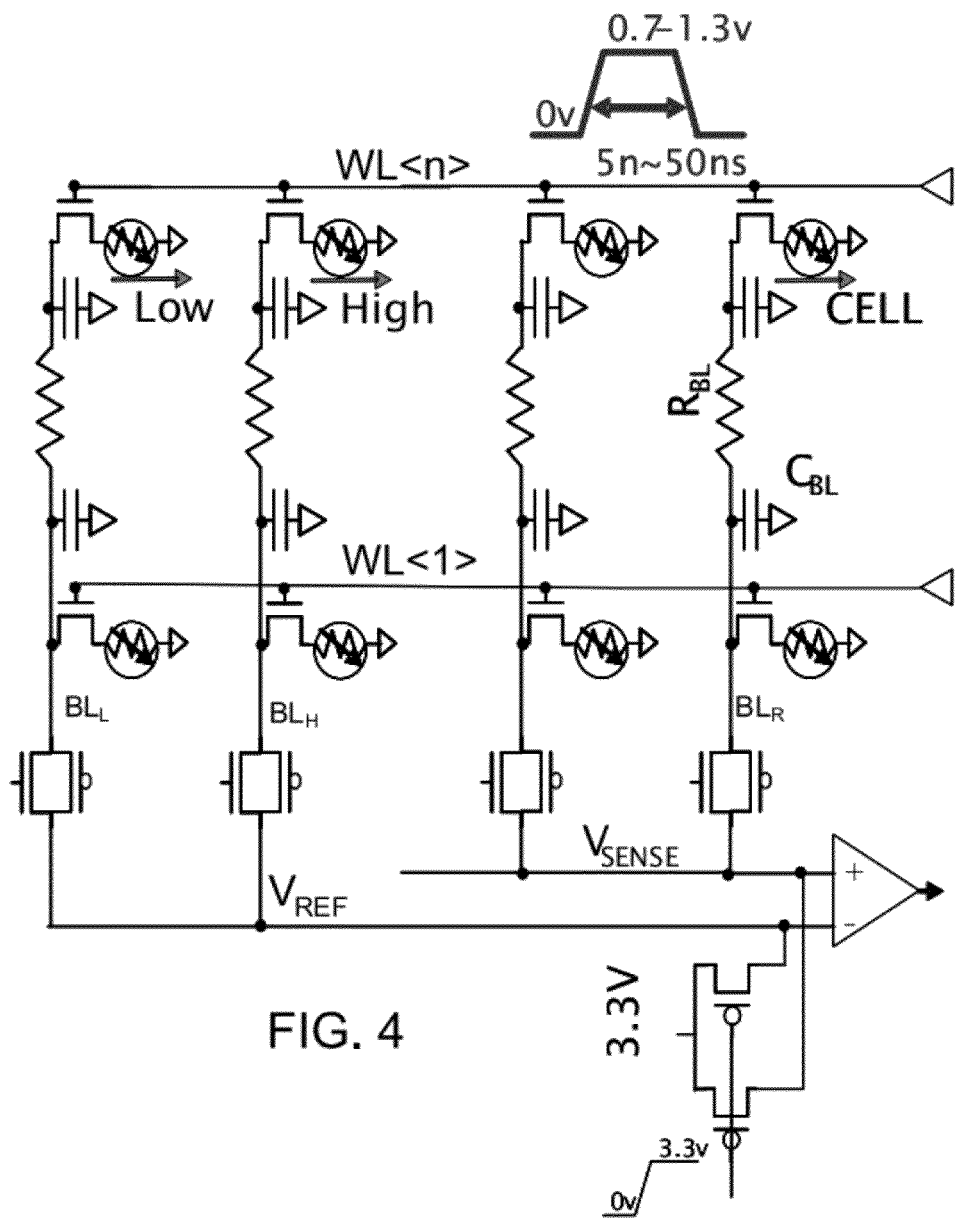
FIG. 4 is a schematic circuit diagram of a memory array.

FIG. 4 is a schematic circuit diagram of a memory array 110. The memory array 110 includes a bit line column $BL_L$ of (two or more) low resistance state resistive memory cells LOW and a bit line column $BL_H$ of (two or more) high resistance state resistive memory cells HIGH and two or more bit line columns $BL_R$ of magneto-resistive changing memory cells CELL arranged in an array where each resistive changing memory cell stores at least one data bit. The illustrated array 110 includes two word lines WL<1> and WL<n>, however, it is understood that the array 110 can include any number of word lines. Each word line electrically couples the transistors for one low resistance state resistive memory cell LOW and one high resistance state resistive memory cell HIGH and two or more resistive changing memory cells CELL along the particular word line row.

Each bit line column is shown having a bit line resistance $R_{BL}$ and a bit line capacitance $C_{BL}$. It is understood that the bit line capacitance $C_{BL}$ may be a physical capacitor, however it more often is the physical structure of the bit line exhibiting the bit line capacitance $C_{BL}$. The low resistance state bit line column and the high resistance state bit line column and at least the selected bit line column where the data CELL is being read, are all precharged to a particular voltage. In many embodiments, these bit lines are precharged to substantially the same charge or voltage level. As, illustrated the bit line columns $BL_L$, $BL_H$ and $BL_R$ have a voltage of 3.3 volts applied to them, effectively precharging these bit line columns to a desired precharge voltage (in this case 3.3 volts). The read operation is initiated by applying a word line voltage pulse to the selected transistors, allowing the precharge voltage to discharge though the HIGH, LOW and CELL magneto-resistive changing memory cells. The resistance state of the magneto-resistive changing memory cell CELL can be determined as described in conjunction with FIG. 5 below.

The word line voltage pulse can have any useful amplitude or width. In many embodiments, the world line voltage pulse has an amplitude just above the threshold voltage of the selected transistor (e.g., from 0.6 to 1.3 V) and a pulse width from 5 to 50 ns. Thus, the word line width and amplitude are not critical.

Figure 5:
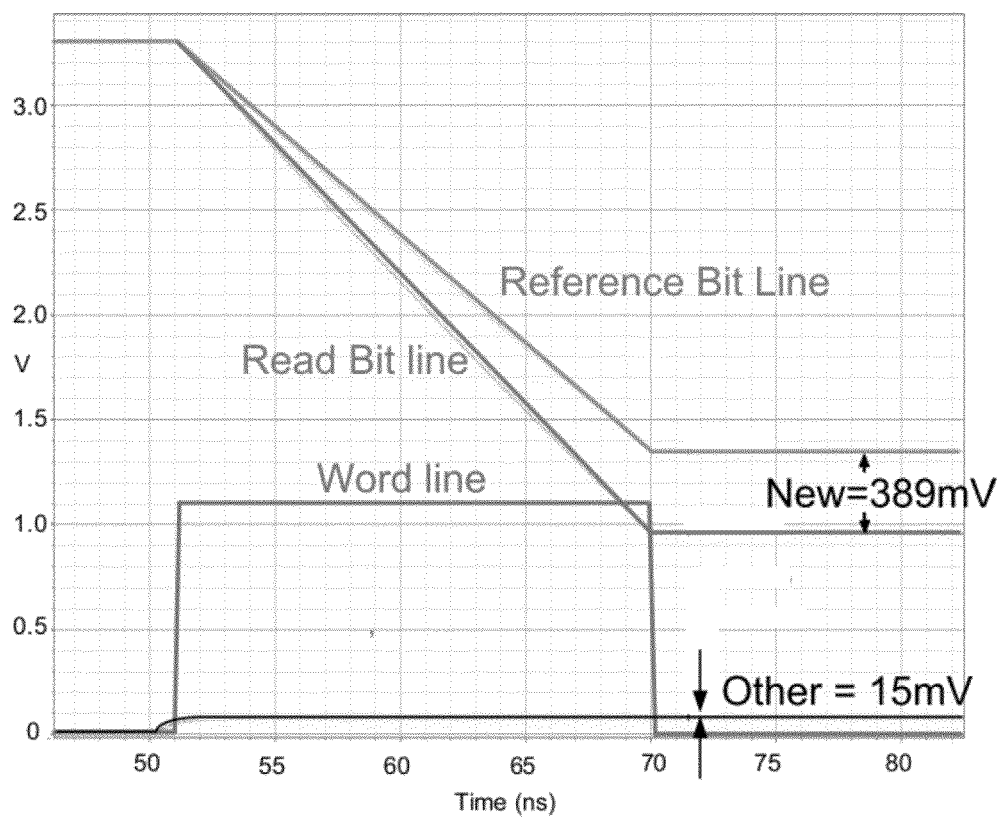
FIG. 5 is a graphical representation of voltage verses time for a read operation according to the present disclosure.

FIG. 5 is a graphical representation of voltage verses time for a read operation according to the present disclosure. In this simulation, the low resistance state bit line column and the high resistance state bit line column and the select bit line column where the data CELL is being read where all precharged to 3.3V. At 51 nanoseconds a word line voltage pulse of 1.1V is applied to allow the precharged voltage to discharge through the low resistance state resistive memory cell LOW and one high resistance state resistive memory cell HIGH and the resistive changing memory cell CELL along the particular word line row. The two reference cells provide the Reference Bit Line voltage (being an average value of the high and low reference resistance state resistive memory cells) and the resistive changing memory cell CELL provides the Read Bit Line voltage. As illustrated, the Reference Bit line voltage value and the Read Bit Line voltage value decay linearly at different rates, depending upon whether the resistive changing memory cell CELL is in the high resistance data state or the low resistance data state. In this example, the resistive changing memory cell CELL is in the low resistance data state and at time equal to 70 ns, the word line pulse is deactivated, setting the Reference Bit Line voltage value at about 1.34 V and the Read Bit Line voltage value at about 0.96 V, providing a sensing margin of 389 mV. If the resistive changing memory cell CELL was in the high resistance data state, the Read Bit Line voltage value would be about 389 mV greater than the Reference Bit line voltage value at about 1.34 V.

Figure 6:
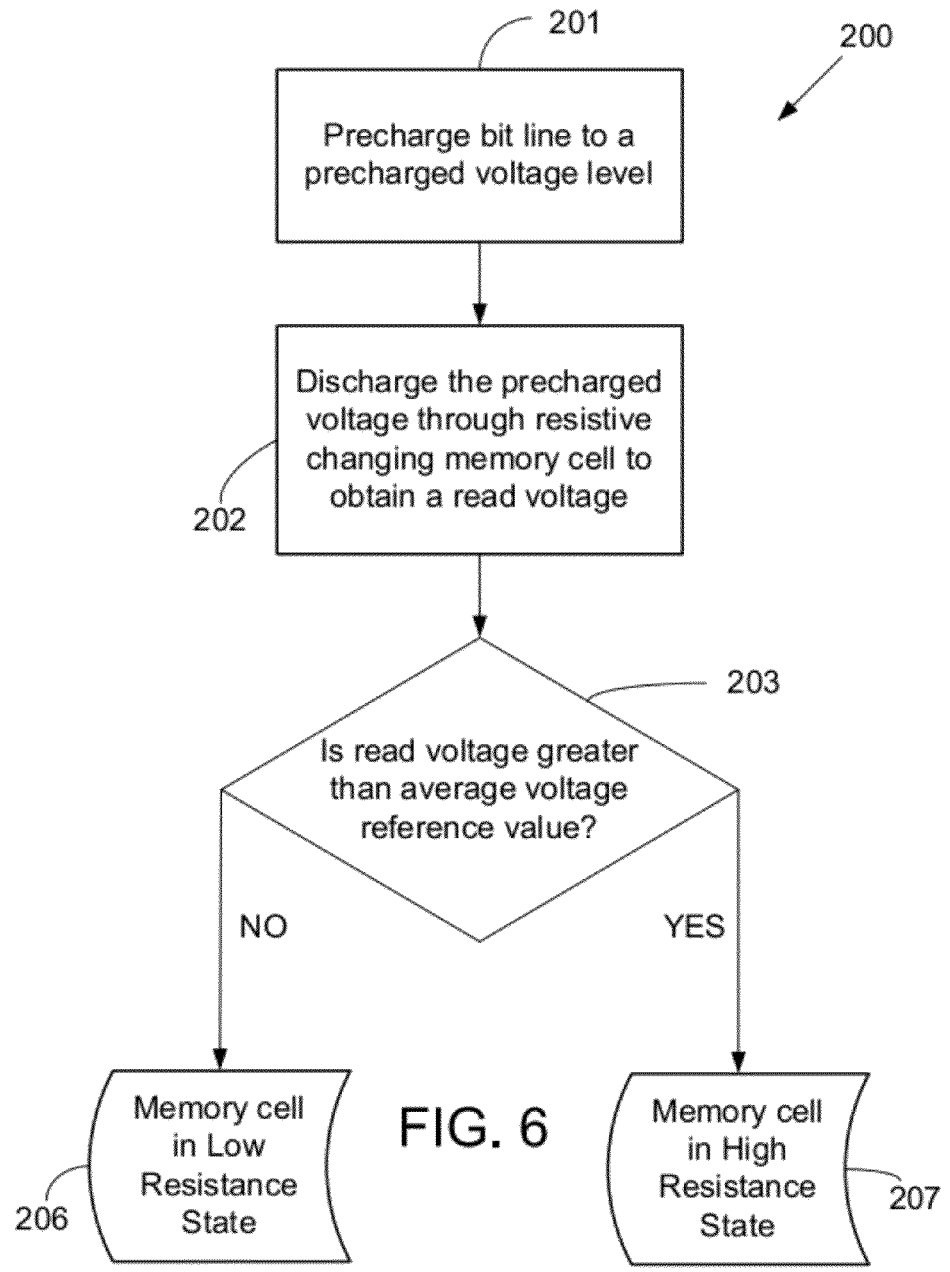
FIG. 6 is an illustrative flow diagram for a read operation according to the present disclosure.

FIG. 5 also illustrates another read operation utilizing steady current injection with the line labeled Other. As illustrated, the other read operation provides a sensing margin of only about 15 mV. The single Other line is actually two lines (reference at 90 mV and bit line at 75 mV) that are so close to each other that they appear as a single line. Thus, the disclosed read operation utilizing bit line charge accumulation for resistive changing memory increases the sensing margin FIG. 6 is an illustrative flow diagram for a read operation 200 according to the present disclosure. The method includes the steps of precharging a bit line to a precharged voltage level at block 201. Then method includes discharging the precharged voltage through resistive changing memory cell to obtain a read voltage at block 202. The read voltage is then compared with the average voltage reference value to determine the resistance state of the selected variable resistive memory cell at block 203. If the read voltage is less than the average voltage reference value, then the memory cell is in the low resistance state at block 206. If the read voltage is greater than the average voltage reference value, then the memory cell is in the high resistance state at block 207.

Some advantages of this bit line charge accumulation sensing method include; bit line resistance variation can be disregarded since the bit line lengths for the read cell and the high and low resistance state reference cells are relatively equal, the word line pulse width and amplitude are not critical since the relative difference between the reference bit line voltage and read bit line voltage is can compared at any time during the word line voltage pulse, as illustrated in FIG. 5, and the method is less sensitive to power noise. In addition, this method provides a large voltage difference between the reference voltage and the sensed voltage, allowing for a robust read operation.

While magnetic or magneto-resistive RAM (MRAM) is illustrated, the disclosure is useful for any resistive changing RAM includes, for example, spin-transfer torque Random Access Memory (STRAM), phase change RAM (PCRAM), and the like.

Thus, embodiments of the BIT LINE CHARGE ACCUMULATION SENSING FOR RESISTIVE CHANGING MEMORY are disclosed. The implementations described above and other implementations are within the scope of the following claims. One skilled in the art will appreciate that the present disclosure can be practiced with embodiments other than those disclosed. The disclosed embodiments are presented for purposes of illustration and not limitation, and the present invention is limited only by the claims that follow.

What is claimed is:

1. A memory array comprising:
   a plurality of spin-transfer torque memory cells, each spin-transfer torque memory cells electrically between a source line and a bit line and a transistor electrically coupled to the spin-transfer torque memory cells and the bit line, the transistor having a gate electrically between a source region and a drain region and the source region being electrically between the spin-transfer torque memory cell and the gate, a word line is electrically coupled to the gate; and
   a high resistance state resistive changing memory cell and a low resistance state resistive changing memory cell that provide an average voltage reference value when a read operation is applied across a selected spin-transfer torque memory cell along a same word line row connecting the transistor, the high resistance state resistive changing memory cell, and the low resistance state resistive changing memory cell.

2. The memory array according to claim 1, further comprising:
   a plurality of high resistance state resistive changing memory cells, each high resistance state resistive changing memory cell is electrically coupled to a high resistance state transistor, and the high resistance state transistor is electrically coupled to a reference voltage word line; and
   a plurality of low resistance state resistive changing memory cells, each low resistance state resistive changing memory cell is electrically connected to a low resistance state transistor, and the low resistance state transistor is electrically coupled to the reference voltage word line;
   wherein one high resistance state resistive changing memory cell and one low resistance state resistive changing memory cell provide an average voltage reference value when a read operation is applied across a selected resistive changing memory cell along a same word line row connecting the transistor, the high resistance state transistor, and the low resistance state transistor.

3. The memory array according to claim 2, further comprising a sense amplifier that senses the read operation voltage and the average reference voltage.

4. The memory array according to claim 3, wherein the sense amplifier is electrically connected to a high resistance state bit line, a low resistance state bit line and a selected magneto-resistive changing memory cell bit line.

5. A memory array comprising:
   a plurality of spin-transfer torque memory cells, each spin-transfer torque memory cell electrically between a source line and a bit line and a transistor electrically between the spin-transfer torque memory cell and the bit line;
   a plurality of high resistance state spin-transfer torque memory cells, each high resistance state spin-transfer torque memory cell is electrically connected to a high resistance state transistor and the high resistance state transistor is electrically coupled to a reference voltage word line; and
   a plurality of low resistance state spin-transfer torque memory cells, each low resistance state spin-transfer torque memory cell is electrically connected to a low resistance state transistor and the low resistance state transistor is electrically coupled to the reference voltage word line;
   wherein one high resistance state spin-transfer torque memory cell and one low resistance state spin-transfer torque memory cell provide an average voltage reference value when a read operation is applied across a selected spin-transfer torque memory cell along a same word line row connecting the transistor, the high resistance state transistor, and the low resistance state transistor.

6. The memory array according to claim 5, further comprising a sense amplifier that senses the read operation voltage and the average reference voltage.

7. The memory array according to claim 6, wherein the sense amplifier is electrically connected to a high resistance state bit line, a low resistance state bit line and a selected spin-transfer torque memory cell bit line.

8. A method of sensing a data state of resistive changing memory, comprising steps of:
   precharging a bit line to a predetermined voltage value;
   discharging the bit line charge through a selected spin-transfer torque memory cell and reducing the bit line precharge voltage value to a bit line voltage value; sensing the bit line voltage value to determine a data state of the spin-transfer torque memory cell by comparing the bit line voltage value to an average reference voltage value to determine a data state of the spin-transfer torque memory cell; and
   precharging a high resistance state bit line and a low resistance state bit line to a predetermined reference charge level having a reference precharge voltage value, and discharging the reference charge level through a high resistance state spin-transfer torque memory cell and a low resistance state spin-transfer torque memory cell to obtain the average reference voltage value.

9. The method according to claim 8, wherein the sensing step further comprises comparing the bit line voltage value to the average reference voltage value to determine a data state of the spin-transfer torque memory cell.

10. The method according to claim 9, wherein the predetermined reference charge level is substantially the same as the predetermined bit line charge level.

11. The method according to claim 9, wherein the predetermined reference charge level is discharged at substantially the same time as the predetermined bit line charge level.

12. The method according to claim 11, wherein the predetermined reference charge level stops discharging at substantially the same time as the predetermined bit line charge level.

* * * * *